(12) United States Patent  (10) Patent No.: US 7,746,539 B2
Sampsell  (45) Date of Patent: Jun. 29, 2010

(54) METHOD FOR PACKING A DISPLAY DEVICE AND THE DEVICE OBTAINED THEREOF

(75) Inventor: Jeffrey B. Sampsell, Pueblo West, CO (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 12/146,388

(22) Filed: Jun. 25, 2008

(65) Prior Publication Data

US 2009/0323165 A1 Dec. 31, 2009

(51) Int. Cl.
G02B 26/00 (2006.01)
G02F 1/29 (2006.01)

(52) U.S. Cl. .................. 359/290; 359/237; 359/318

(58) Field of Classification Search ......... 359/290–292, 359/295, 223–224, 298, 197–198, 301–303, 359/237, 242, 245, 317–318
See application file for complete search history.

(56) References Cited

U.S. PATENT DOCUMENTS

| | | | |
|---|---|---|---|
| 3,728,030 A | 4/1973 | Hawes | |
| 3,955,190 A | 5/1976 | Teraishi | |
| 4,403,248 A | 9/1983 | Te Velde | |
| 4,441,791 A | 4/1984 | Hornbeck | |
| 4,786,128 A | 11/1988 | Birnbach | |
| 4,859,060 A | 8/1989 | Katagiri et al. | |
| 4,954,789 A | 9/1990 | Sampsell | |
| 4,956,619 A | 9/1990 | Hornbeck | |
| 4,982,184 A | 1/1991 | Kirkwood | |
| 5,022,745 A | 6/1991 | Zayhowski et al. | |
| 5,028,939 A | 7/1991 | Hornbeck et al. | |
| 5,091,983 A | 2/1992 | Lukosz | |
| 5,096,279 A | 3/1992 | Hornbeck et al. | |
| 5,170,283 A | 12/1992 | O'Brien et al. | |
| 5,315,370 A | 5/1994 | Bulow | |
| 5,381,232 A | 1/1995 | van Wijk | |

(Continued)

FOREIGN PATENT DOCUMENTS

EP 0 668 490 8/1995

(Continued)

OTHER PUBLICATIONS

Pape et al., Characteristics of the deformable mirror device for optical information processing, Optical Engineering, 22(6):676-681, Nov.-Dec. 1983.

(Continued)

Primary Examiner—Scott J Sugarman
Assistant Examiner—Dawayne A Pinkney
(74) Attorney, Agent, or Firm—Knobbe Martens Olson & Bear LLP

(57) ABSTRACT

A method for packaging a display device and the device obtained thereof are disclosed. In one aspect, the method comprises providing a substrate. The method further comprises manufacturing an array of display elements on a back side of the substrate, the array comprising a plurality of posts between the display elements connecting electrodes of the display elements. The method further comprises providing a back plate. The method further comprises sealing the back plate to the back side of the substrate, wherein one or more posts are in contact with the back plate after sealing the back plate to the back side of the substrate.

42 Claims, 13 Drawing Sheets

U.S. PATENT DOCUMENTS

| | | |
|---|---|---|
| 5,452,024 A * | 9/1995 | Sampsell .................... 348/755 |
| 5,452,138 A | 9/1995 | Mignardi et al. |
| 5,471,341 A | 11/1995 | Warde et al. |
| 5,526,172 A | 6/1996 | Kanack |
| 5,559,358 A | 9/1996 | Burns et al. |
| 5,636,052 A | 6/1997 | Arney et al. |
| 5,646,729 A | 7/1997 | Koskinen et al. |
| 5,646,768 A | 7/1997 | Kaeriyama |
| 5,661,592 A | 8/1997 | Bornstein et al. |
| 5,665,997 A | 9/1997 | Weaver et al. |
| 5,710,656 A | 1/1998 | Goossen |
| 5,734,177 A | 3/1998 | Sakamoto |
| 5,786,927 A | 7/1998 | Greywall |
| 5,808,781 A | 9/1998 | Arney et al. |
| 5,818,095 A | 10/1998 | Sampsell |
| 5,825,528 A | 10/1998 | Goossen |
| 5,838,484 A | 11/1998 | Goossen |
| 5,867,302 A | 2/1999 | Fleming |
| 5,914,804 A | 6/1999 | Goossen |
| 5,920,418 A | 7/1999 | Shiono et al. |
| 6,028,689 A | 2/2000 | Michalicek et al. |
| 6,040,937 A | 3/2000 | Miles |
| 6,055,090 A | 4/2000 | Miles |
| 6,262,697 B1 | 7/2001 | Stephenson |
| 6,327,071 B1 | 12/2001 | Kimura |
| 6,356,378 B1 | 3/2002 | Huibers |
| 6,384,952 B1 | 5/2002 | Clark et al. |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles |
| 6,680,792 B2 | 1/2004 | Miles |
| 6,698,295 B1 | 3/2004 | Sherrer |
| 6,710,908 B2 | 3/2004 | Miles et al. |
| 6,794,119 B2 | 9/2004 | Miles |
| 6,813,059 B2 | 11/2004 | Hunter et al. |
| 6,841,081 B2 | 1/2005 | Chang et al. |
| 6,844,959 B2 | 1/2005 | Huibers et al. |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,980,350 B2 | 12/2005 | Hung et al. |
| 6,982,820 B2 | 1/2006 | Tsai |
| 7,006,272 B2 | 2/2006 | Tsai |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,184,195 B2 | 2/2007 | Yang |
| 7,184,202 B2 | 2/2007 | Miles et al. |
| 7,198,873 B2 | 4/2007 | Geh et al. |
| 7,221,495 B2 | 5/2007 | Miles et al. |
| 7,236,284 B2 | 6/2007 | Miles |
| 7,289,259 B2 | 10/2007 | Chui et al. |
| 7,302,157 B2 | 11/2007 | Chui |
| 7,321,456 B2 | 1/2008 | Cummings |
| 7,321,457 B2 | 1/2008 | Heald |
| 7,327,510 B2 | 2/2008 | Cummings et al. |
| 7,372,613 B2 | 5/2008 | Chui et al. |
| 7,372,619 B2 | 5/2008 | Miles |
| 7,385,744 B2 | 6/2008 | Kogut et al. |
| 7,385,762 B2 | 6/2008 | Cummings |
| 7,420,725 B2 | 9/2008 | Kothari |
| 7,612,933 B2 | 11/2009 | Djordjev |
| 7,629,197 B2 | 12/2009 | Luo et al. |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kudrle et al. |
| 2002/0149828 A1 | 10/2002 | Miles et al. |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0051929 A1 | 3/2004 | Sampsell et al. |
| 2004/0058532 A1 | 3/2004 | Miles et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0125281 A1 | 7/2004 | Lin |
| 2004/0125282 A1 | 7/2004 | Lin et al. |
| 2004/0145811 A1 | 7/2004 | Lin et al. |
| 2004/0147198 A1 | 7/2004 | Lin et al. |
| 2004/0175577 A1 | 9/2004 | Lin et al. |
| 2004/0184134 A1 | 9/2004 | Makigaki |
| 2004/0207897 A1 | 10/2004 | Lin |
| 2004/0209195 A1 | 10/2004 | Lin |
| 2004/0217919 A1 | 11/2004 | Piehl et al. |
| 2004/0218251 A1 | 11/2004 | Piehl et al. |
| 2004/0240032 A1 | 12/2004 | Miles |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0068627 A1 | 3/2005 | Nakamura et al. |
| 2005/0078348 A1 | 4/2005 | Lin |
| 2005/0168849 A1 | 8/2005 | Lin |
| 2005/0179378 A1 | 8/2005 | Oooka et al. |
| 2005/0195462 A1 | 9/2005 | Lin |
| 2005/0249966 A1 | 11/2005 | Tung et al. |
| 2005/0254115 A1 | 11/2005 | Palmateer et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066641 A1 | 3/2006 | Gally et al. |

| | | |
|---|---|---|
| 2006/0066926 A1 | 3/2006 | Kwak et al. |
| 2006/0067649 A1 | 3/2006 | Tung et al. |
| 2006/0067651 A1 | 3/2006 | Chui |
| 2006/0077152 A1 | 4/2006 | Chui et al. |
| 2006/0077155 A1 | 4/2006 | Chui et al. |
| 2006/0077156 A1 | 4/2006 | Chui et al. |
| 2006/0077533 A1* | 4/2006 | Miles et al. ............... 359/321 |
| 2006/0079048 A1 | 4/2006 | Sampsell |
| 2006/0220160 A1 | 10/2006 | Miles |
| 2006/0262380 A1 | 11/2006 | Miles |
| 2006/0268388 A1 | 11/2006 | Miles |
| 2006/0274398 A1 | 12/2006 | Chou |
| 2007/0020948 A1 | 1/2007 | Piehl et al. |
| 2007/0077525 A1 | 4/2007 | Davis et al. |
| 2007/0086078 A1 | 4/2007 | Hagood et al. |
| 2007/0121118 A1 | 5/2007 | Gally et al. |
| 2007/0177247 A1 | 8/2007 | Miles |
| 2007/0194630 A1 | 8/2007 | Mignard et al. |
| 2007/0216987 A1 | 9/2007 | Hagood et al. |
| 2007/0279729 A1 | 12/2007 | Kothari et al. |
| 2007/0285761 A1 | 12/2007 | Zhong et al. |
| 2008/0013144 A1 | 1/2008 | Chui et al. |
| 2008/0013145 A1 | 1/2008 | Chui et al. |
| 2008/0013154 A1 | 1/2008 | Chui |
| 2008/0037093 A1 | 2/2008 | Miles |
| 2008/0055705 A1 | 3/2008 | Kothari |
| 2008/0055706 A1 | 3/2008 | Chui et al. |
| 2008/0055707 A1 | 3/2008 | Kogut et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1* | 4/2008 | Luo et al. ............... 359/318 |
| 2008/0106782 A1 | 5/2008 | Miles |
| 2008/0110855 A1 | 5/2008 | Cummings |
| 2008/0112035 A1 | 5/2008 | Cummings |
| 2008/0112036 A1 | 5/2008 | Cummings |
| 2008/0186581 A1 | 8/2008 | Bita et al. |
| 2008/0239455 A1 | 10/2008 | Kogut et al. |
| 2008/0247028 A1 | 10/2008 | Chui et al. |
| 2008/0278787 A1 | 11/2008 | Sasagawa |
| 2008/0278788 A1 | 11/2008 | Sasagawa |
| 2008/0316566 A1 | 12/2008 | Lan |
| 2008/0316568 A1 | 12/2008 | Griffiths et al. |
| 2009/0009845 A1 | 1/2009 | Endisch et al. |
| 2009/0068781 A1 | 3/2009 | Tung et al. |
| 2009/0073534 A1 | 3/2009 | Lee et al. |
| 2009/0073539 A1 | 3/2009 | Mignard |
| 2009/0080060 A1 | 3/2009 | Sampsell et al. |
| 2009/0103166 A1 | 4/2009 | Khazeni et al. |
| 2009/0135465 A1 | 5/2009 | Chui |
| 2009/0147343 A1 | 6/2009 | Kogut et al. |
| 2009/0201566 A1 | 8/2009 | Kothari |
| 2009/0213450 A1 | 8/2009 | Sampsell |
| 2009/0213451 A1 | 8/2009 | Tung et al. |
| 2009/0225395 A1 | 9/2009 | Ganti et al. |
| 2009/0231666 A1 | 9/2009 | Gudlavalleti et al. |
| 2009/0251761 A1 | 10/2009 | Khazeni et al. |
| 2009/0256218 A1 | 10/2009 | Mignard et al. |
| 2009/0257105 A1 | 10/2009 | Xu et al. |
| 2009/0273823 A1 | 11/2009 | Tung et al. |
| 2009/0273824 A1 | 11/2009 | Sasagawa |
| 2009/0279162 A1 | 11/2009 | Chui |

FOREIGN PATENT DOCUMENTS

| | | |
|---|---|---|
| EP | 1 122 577 | 8/2001 |
| EP | 1 227 346 | 7/2002 |
| EP | 1 275 997 | 1/2003 |
| EP | 1 473 581 | 11/2004 |
| JP | 5-49238 | 2/1993 |
| JP | 5-281479 | 10/1993 |
| JP | 11211999 | 8/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2004-012642 | 1/2004 |
| JP | 2004-212638 | 7/2004 |
| JP | 2004-212680 | 7/2004 |
| JP | 2005 279831 | 10/2005 |
| WO | WO 02/086582 | 10/2002 |
| WO | WO 2007/053438 | 5/2007 |
| WO | WO 07/072998 | 6/2007 |

OTHER PUBLICATIONS

Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.

Miles, Interferometric modulation: MOEMS as an enabling technology for high performance reflective displays, Proceedings of SPIE, vol. 4985, pp. 131-139, 2003.

Conner, "Hybrid Color Display Using Optical Interference Filter Array," SID Digest, pp. 577-580 (1993).

Feenstra et al., Electrowetting displays, Liquivista BV, 16 pp., Jan. 2006.

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, Vol. Conf. 6, Jun. 24, 1991, pp. 372-375.

Lezec, Submicrometer dimple array based interference color field displays and sensors, Nano Lett. 7(2):329-333, Dec. 23, 2006.

Miles, A New Reflective FPD Technology Using Interferometric Modulation, Journal of the SID, 5/4, 1997.

Taii et al., "A transparent sheet display by plastic MEMS," Journal of the SID 14(8):735-741, 2006.

Longhurst, 1963, Chapter IX: Multiple Beam Interferometry, in Geometrical and Physical Optics, pp. 153-157.

Tolansky, 1948, Chapter II: Multiple-Beam Interference, in Multiple-bean Interferometry of Surfaces and Films, Oxford at the Clarendon Press, pp. 8-11.

* cited by examiner

METHOD FOR PACKING A DISPLAY DEVICE AND THE DEVICE OBTAINED THEREOF

BACKGROUND OF THE INVENTION

1. Field of the Invention

The field of the invention relates to microelectromechanical systems (MEMS).

2. Description of the Related Technology

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN INVENTIVE ASPECTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

In one aspect, a method of packaging a display device is disclosed. The method comprises providing a substrate; manufacturing an array of display elements on a back side of the substrate, the array comprising a plurality of posts between the display elements connecting electrodes of the display elements; providing a back plate; and sealing the back plate to the back side of the substrate, wherein one or more posts are in contact with the back plate after sealing the back plate to the back side of the substrate.

In another aspect, a method of packaging a display device is disclosed. The method comprises providing a substrate; manufacturing an array of display elements on a back side of the substrate comprising suitable landing areas between the display elements and a plurality of posts between the display elements connecting electrodes of the display elements; providing a back plate comprising a plurality of support posts; and sealing the back plate to the back side of the substrate by aligning the support posts with the landing areas.

In another aspect, a method of packaging a display device is disclosed. The method comprises providing a substrate; manufacturing an array of display elements on a back side of the substrate comprising a plurality of support posts between the display elements and a plurality of connection posts between the display elements connecting electrodes of the display elements; providing a back plate; and sealing the back plate to the back side of the substrate.

In another aspect, a display device is disclosed. The device comprises a front panel comprising an array of display elements on a back side of a substrate, the array comprising a plurality of posts between the display elements connecting electrodes of the display elements, wherein one or more posts are in contact with the back plate; and a back plate sealed to the back side of the substrate.

In another aspect, a display device disclosed. The device comprises a front panel comprising an array of display elements on a back side of a substrate, the array comprising suitable landing areas between the display elements and a plurality of posts between the display elements connecting electrodes of the display elements; and a back plate sealed to the back side of the substrate, the back plate comprising a plurality of support posts.

In another aspect, a display device is disclosed. The device comprises a front panel comprising an array of display elements on a back side of a substrate, the array comprising a plurality of support posts between the display elements and a plurality of connection posts between the display elements connecting electrodes of the display elements; and a back plate sealed to the back side of the substrate.

In another aspect, a display device is disclosed. The device comprises means for modulating light transmitted through said supporting means, means for supporting the modulating means, means for enclosing the modulating means; and means for providing support to said enclosing means when the enclosing means is joined to the supporting means to form a package.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Certain embodiments as will be described below relate to a method of packaging a MEMS display device and a device obtained thereof. In one embodiment, the device is formed by joining a back plate to a substrate including an array of interferometric modulators thereon. Various structures are included in the package to keep a minimum distance between the back plate and the substrate.

Figure 1:
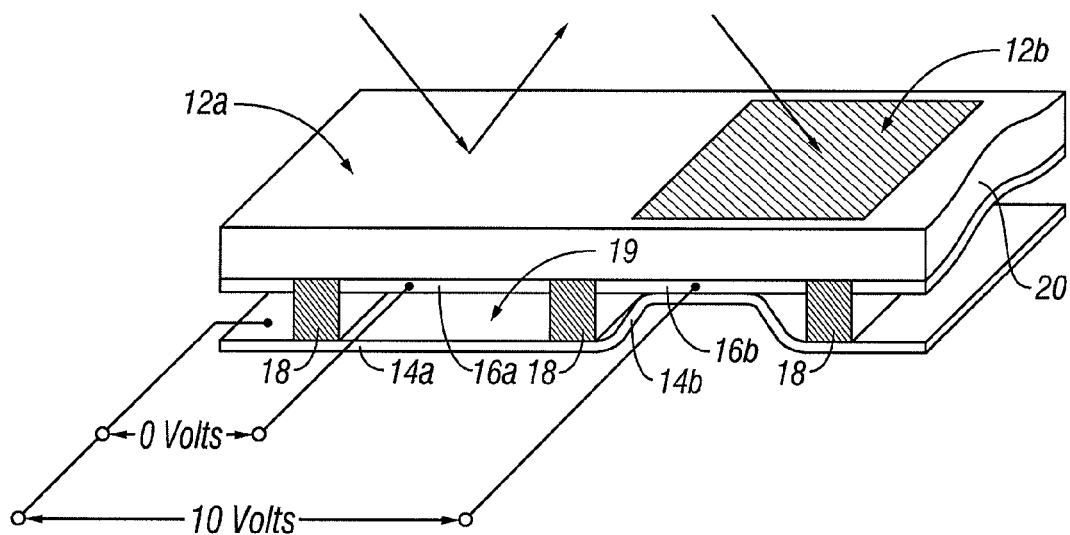
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
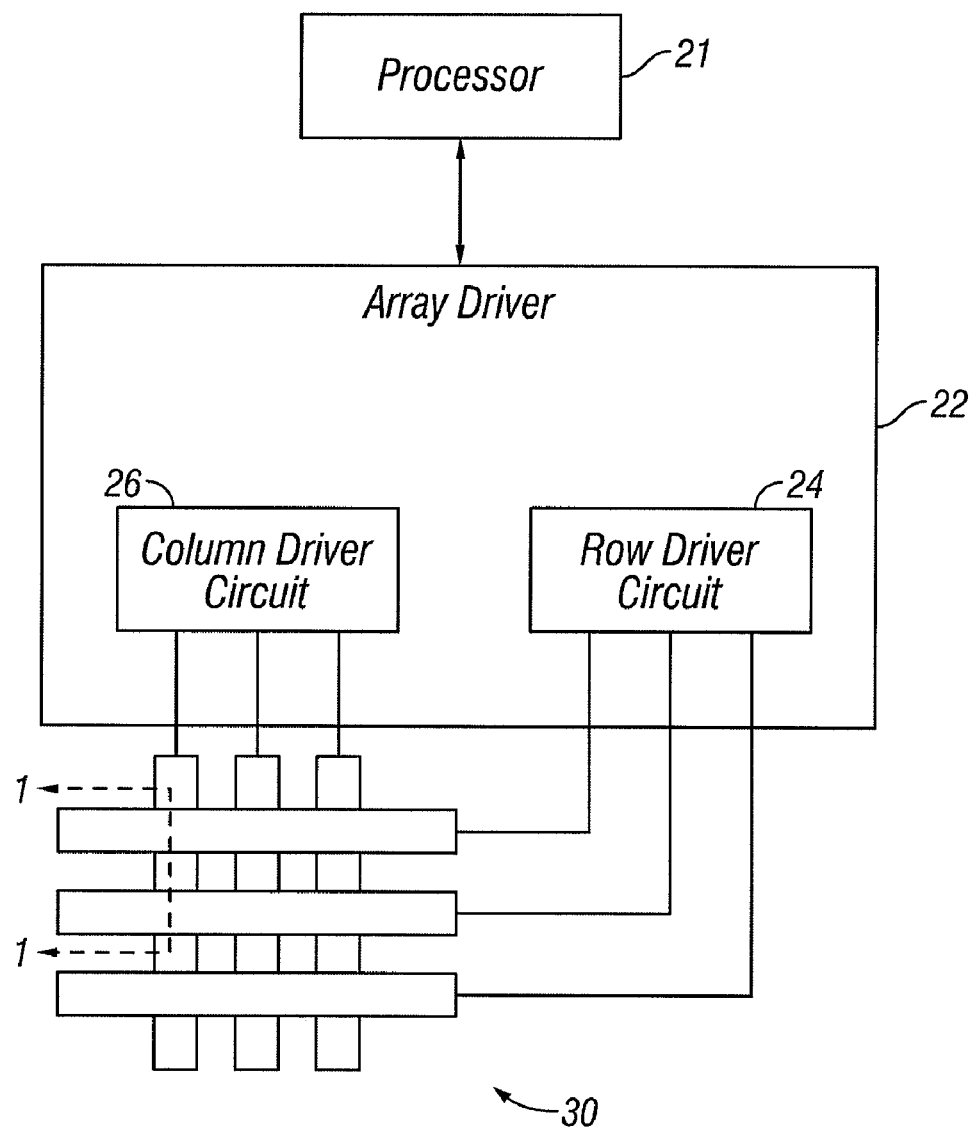
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
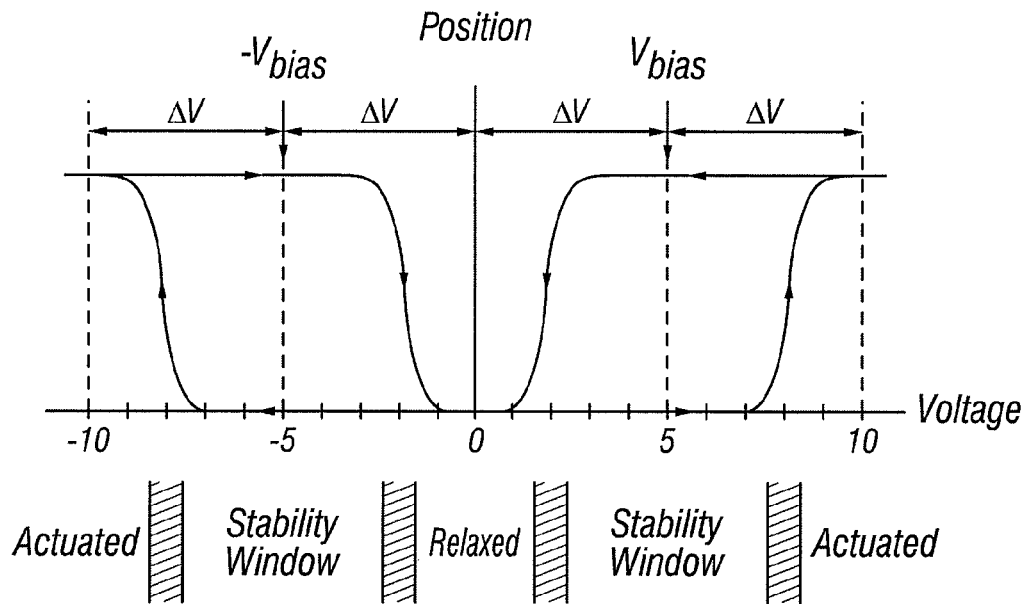
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
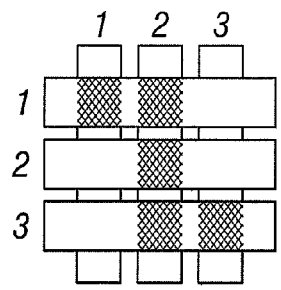
FIG. 5A illustrates one exemplary frame of display data in the 3×3 interferometric modulator display of FIG. 2.
Figure 5B:
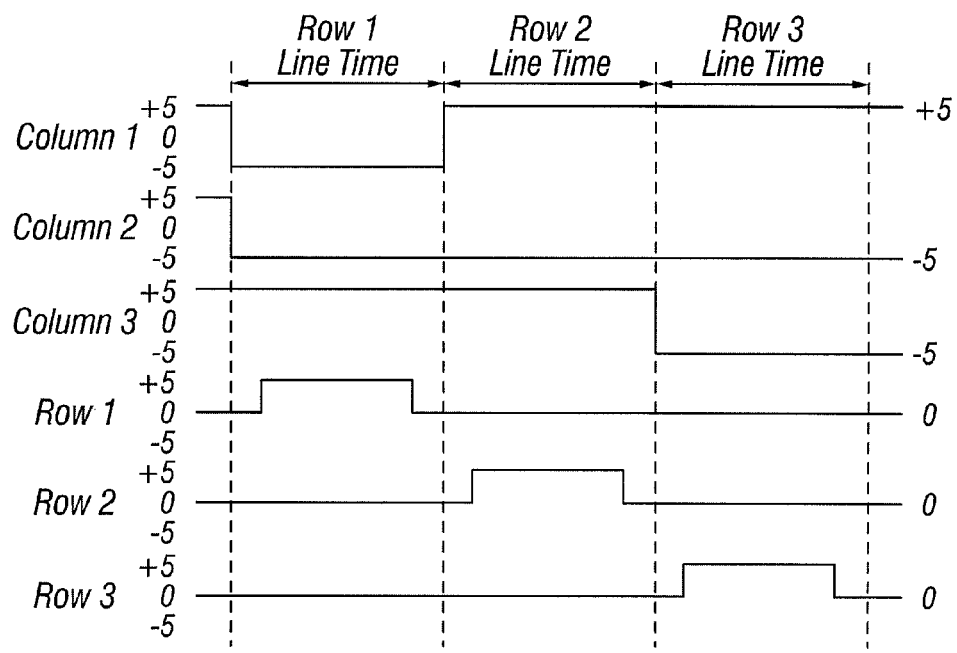
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
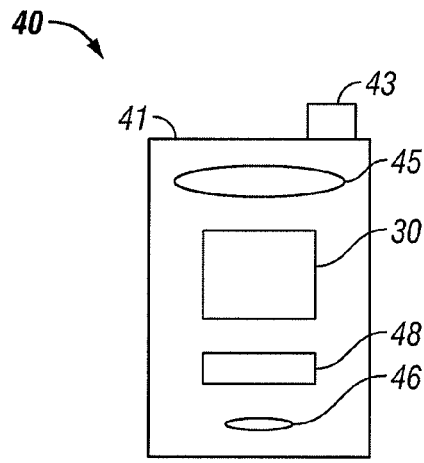
FIGS. 6A and 6B are system block diagrams illustrating an embodiment of a visual display device comprising a plurality of interferometric modulators.
Figure 6B:
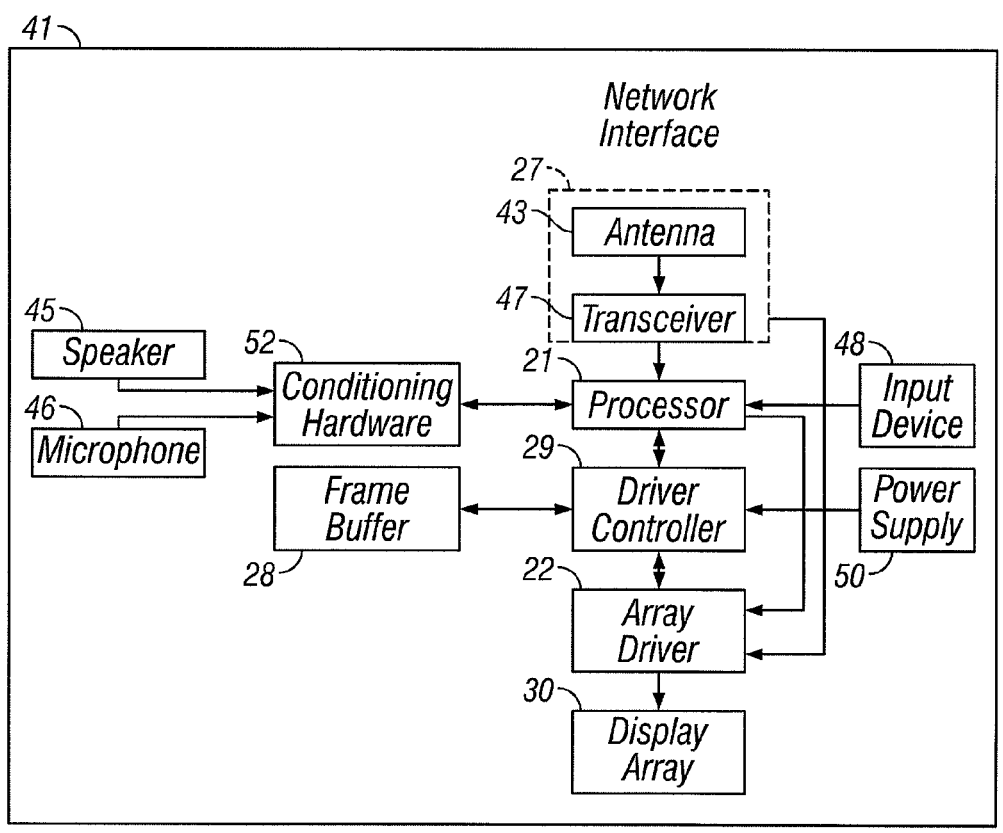

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
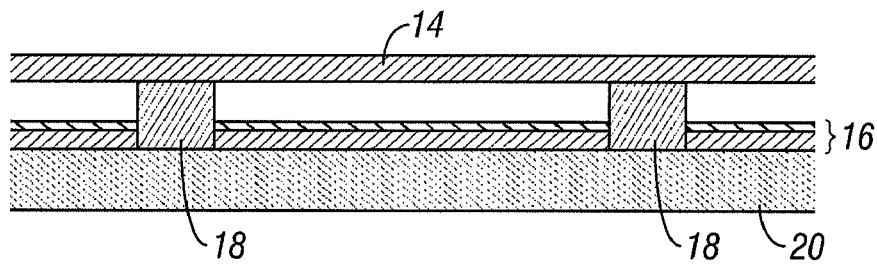
FIG. 7A is a cross section of the device of FIG. 1.
Figure 7B:
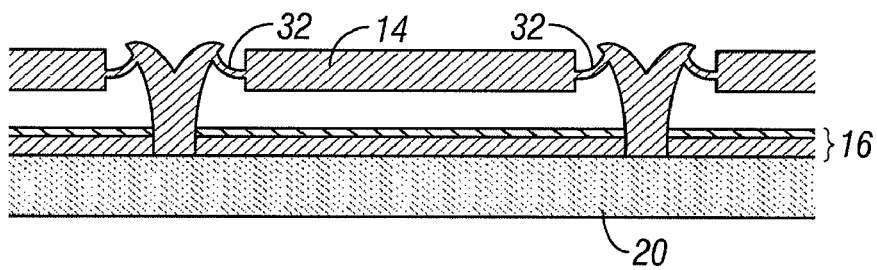
FIG. 7B is a cross section of an alternative embodiment of an interferometric modulator.
Figure 7C:
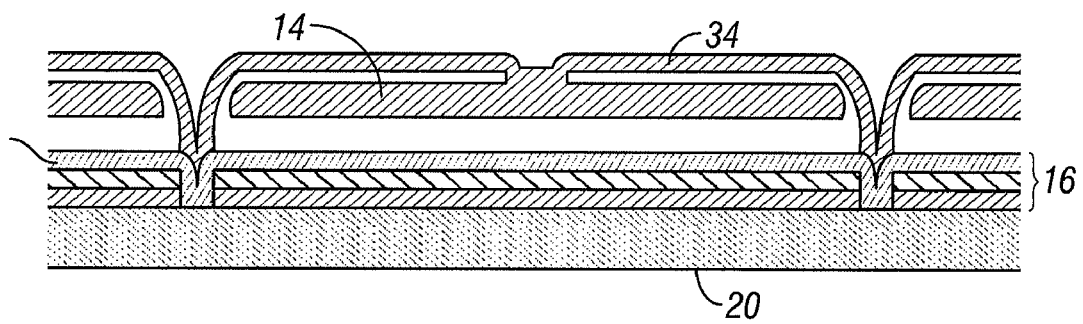
FIG. 7C is a cross section of another alternative embodiment of an interferometric modulator.
Figure 7D:
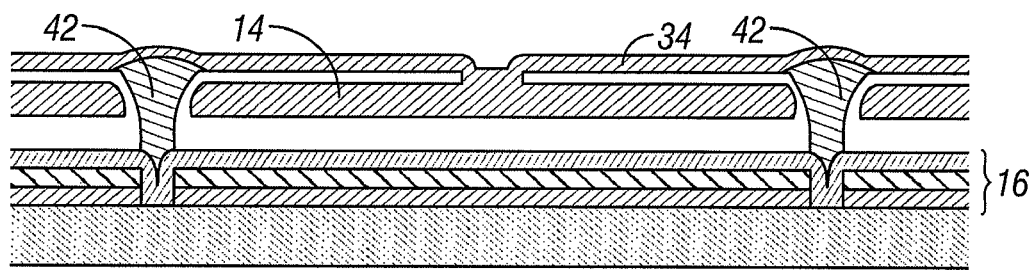
FIG. 7D is a cross section of yet another alternative embodiment of an interferometric modulator.
Figure 7E:
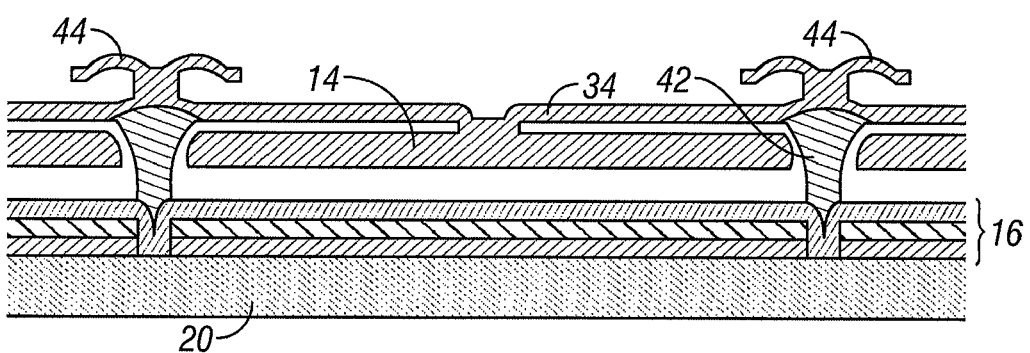
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

The interferometric modulator as described above includes a movable reflective layer 14. The movable layer 14 is typically thin and can be damaged by external force caused by accidental physical contact with objects. To ensure that the interferometric modulator operates properly, it is desirable to protect the movable layer 14 from external force.

Certain embodiments as will be described below with regard to FIGS. 8A-10B relate to a method of packaging a MEMS display device and a device obtained thereof. In one embodiment, a back plate is joined to a substrate including an array of interferometric modulators thereon. The substrate includes posts higher than the movable layer. Upon assembly, the back plate is in contact with the posts but not the movable layer. The back plate, the substrate, and the posts together protect the interferometric modulators from external force. In other embodiments, different structures are formed on the substrate and the back plate to keep a minimum distance between the back plate and the substrate and to prevent the back plate from being in contact with the movable layer.

Figure 8A:
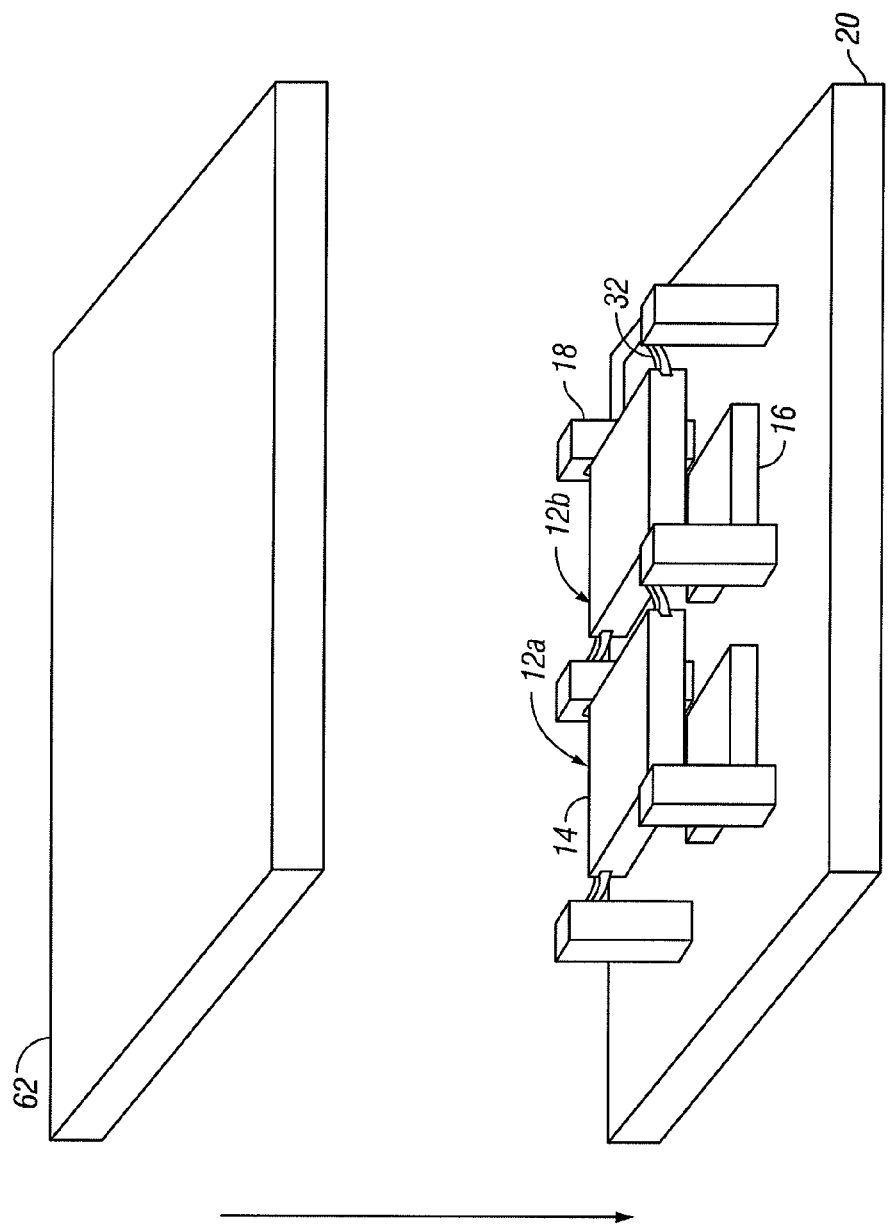
FIGS. 8A and 8B show a side view of an embodiment of a display comprising an array of interferometric modulators in a package.
Figure 8B:
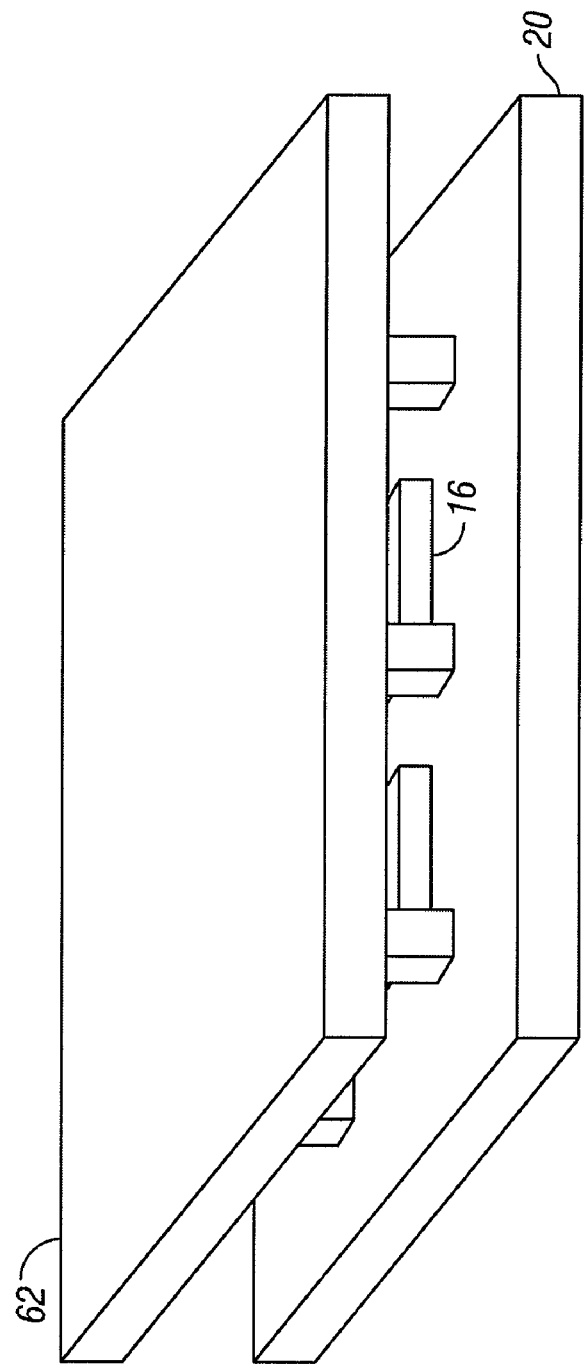

FIGS. 8A-8B show a side view of an embodiment of a display comprising an array of interferometric modulators in a package. In this embodiment, a back plate is joined to a substrate including an array of interferometric modulators thereon. The array of interferometric modulators includes posts connecting the movable layer. Upon assembly, the back plate is in contact with the posts but not the movable layer. The back plate, the substrate, and the posts together protect the interferometric modulators from external force.

As shown, the package comprises a transparent substrate 20 and a back plate 62. The back plate 62 may be glass, metal, foil, polymer, plastic, and ceramic or semiconductor materials such as silicon. The transparent substrate 20 may be any transparent substance that is capable of having thin film, MEMS devices built upon it. Examples include glass, plastic, and transparent polymers.

An array of interferometric modulators is formed on the back side of the substrate 20. The back side of the substrate refers to the side of the substrate 20 distal from a viewer of the display.

The depicted portion of the array in FIGS. 8A-8B includes two adjacent interferometric modulators 12a and 12b. As illustrated, each interferometric modulator includes a movable reflective layer 14 positioned at a variable and controllable distance from an optical stack 16 to form a resonant optical gap with at least one variable dimension. The movable reflective layer 14 may be connected to a supporting structure in various ways as illustrated in FIGS. 7A-7E. For example, the movable reflective layer 14 may be attached to supports 18 on tethers 32 as shown in FIG. 8A.

The optical stacks 16, as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto the transparent substrate 20.

As described with regard to FIG. 1, in some embodiments, the optical stack 16 may form row electrodes. A highly conductive and reflective material such as aluminum may be used for the movable reflective layers 14, and may form column electrodes in a display device. The posts 18 are connected to the electrodes of the movable reflective layer 14 and therefore to the column electrodes of a display device.

The back plate 62 is joined to the back side of the substrate 20 to form a package. In one embodiment, the back plate 62 is joined to the substrate 20 via a non-hermetic seal (not shown). The back plate 62 needs to be separated from the substrate 20 for at least a pre-determined minimum distance such that the back plate 62 does not damage the structure of the pixels 12*a* and 12*b* or interfere with their functioning.

FIG. 8B illustrates the exemplary display with the back plate 62 joined to the substrate 20. As shown, at least one of the posts 18 is in contact with the back plate 62 after the back plate 62 is joined to the substrate 20, thus separating the back plate 62 from the substrate 20. The mechanical support for the back plate 62 thus comes from the at least one post 18 which is used to connect the movable reflective layer 16. In the exemplary embodiment, the post 18 is higher than the movable reflective layer 16 such that the back plate 62 is in contact with the post 18 but not the movable reflective layer 16.

In one embodiment, the posts 18 are designed to have approximately the same height. Therefore, approximately all the posts 18 are in contact with the back plate 62, thus providing mechanical support to the back plate 62. In another embodiment, some of the posts 18 are designed to be higher than others. Only the portion of the posts 18 being the highest among all posts are in contact with the back plate 62.

An exemplary method of packaging a MEMS display device is described as follows. A transparent substrate 20 is provided. An array of MEMS display elements (such as the interferometric modulators 12*a* and 12*b*) are manufactured on a back side of the substrate 20. A back plate 62 is then provided. The back plate 62 is joined to the back side of the substrate 20. The resulting MEMS display device in a package is shown in FIG. 8B.

Figure 9A:
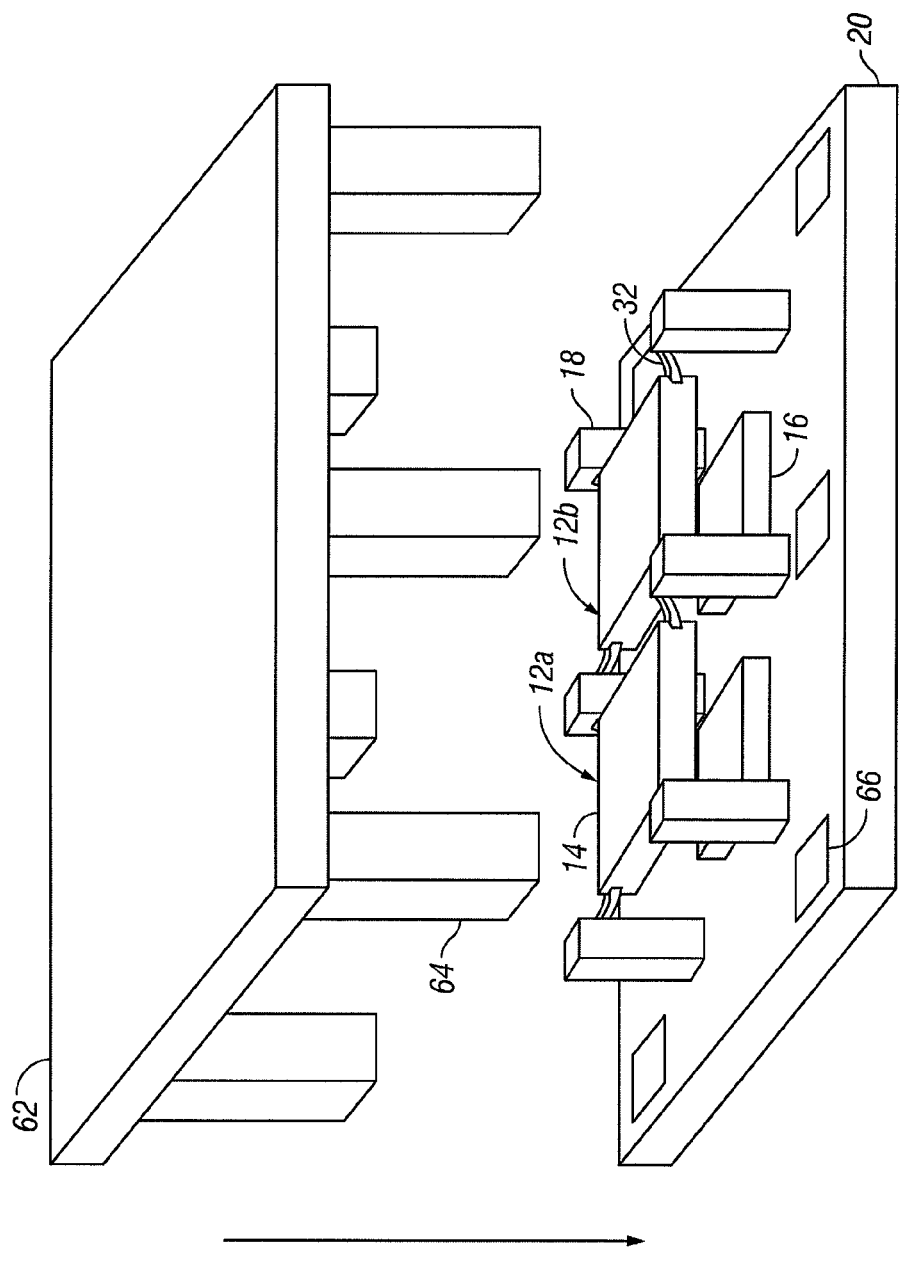
FIGS. 9A and 9B show a side view of an embodiment of a display comprising an array of interferometric modulators in a package.
Figure 9B:
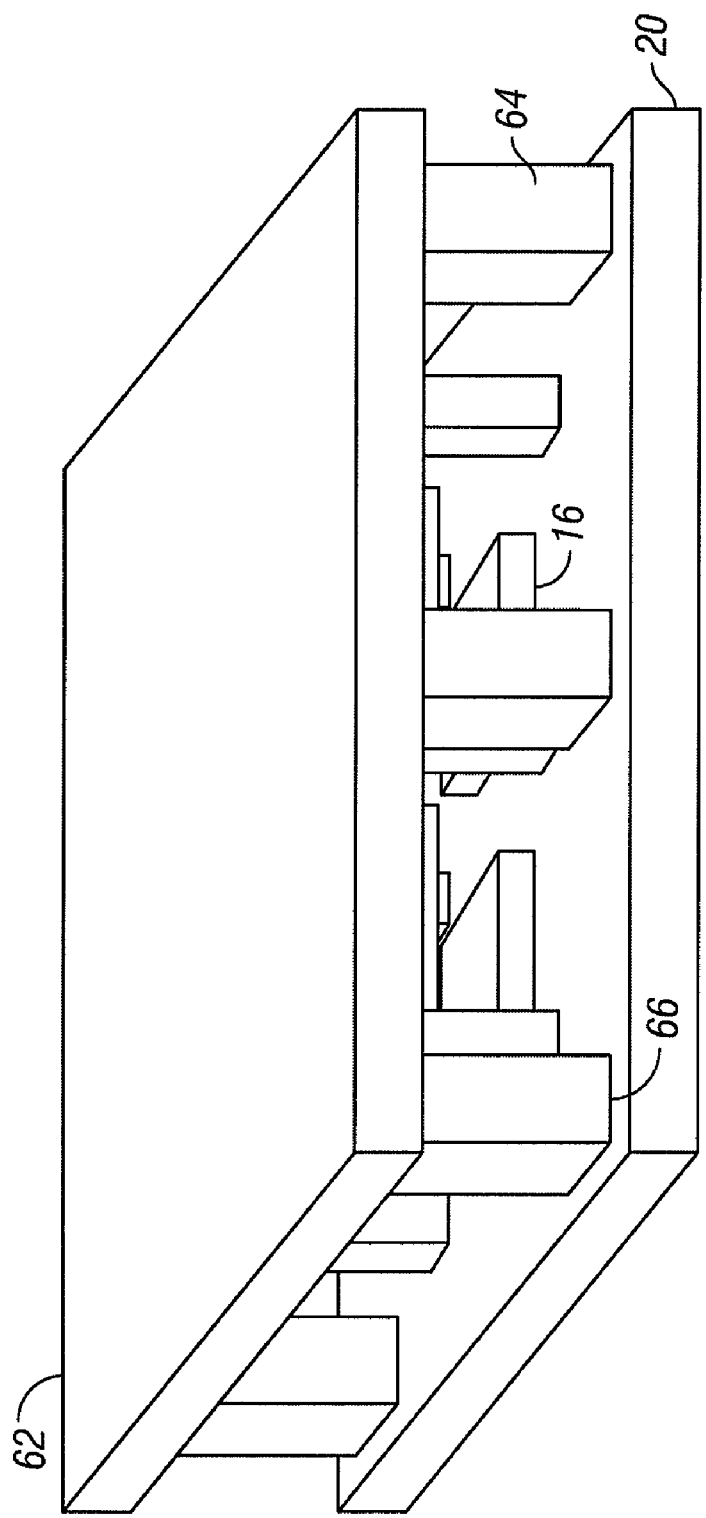

FIGS. 9A-9B show another embodiment of a display comprising an array of interferometric modulators in a package. FIGS. 9A-9B show the side view of the embodiment. The back plate 62 includes support posts 64. When being joined to the substrate 20, the back plate 62 is aligned with the substrate 20 such that each support post 64 aligns with a suitable landing area 66 between the pixels on the substrate 20. Upon assembly, the back plate 62 is in contact with the support posts 64 but not the movable layer 14. The back plate, the substrate, and the support posts 64 together protect the interferometric modulators from external force.

FIG. 9B illustrates the exemplary display with the back plate 62 joined to the substrate 20. As shown, the support posts 64 are in contact with the landing areas 66 on the substrate 20, thus separating the back plate 62 from the substrate 20. The posts 18 are not in contact with back plate 62 and thus under no mechanical force from the back plate 62.

In the package, the support posts 64 and the corresponding landing areas 66 are chosen such that, upon assembly, the support posts 64 do not interfere with the functioning of the pixels 12*a* and 12*b*. The support posts 64 are typically designed to have the same height. In some embodiments, the support posts 64 are designed to be the same to simplify the manufacturing process. Also, the support posts 64 are designed to have the appropriate height such that the posts 18 on the substrate 20 are not in contact with the back plate 62 upon assembly.

In one embodiment, each landing area 66 includes a hole in the surface of the substrate 20. When joining the back plate 62 to the substrate 20, each support post 64 is aligned with, and then dropped into, a hole of the corresponding landing area 66.

Figure 10A:
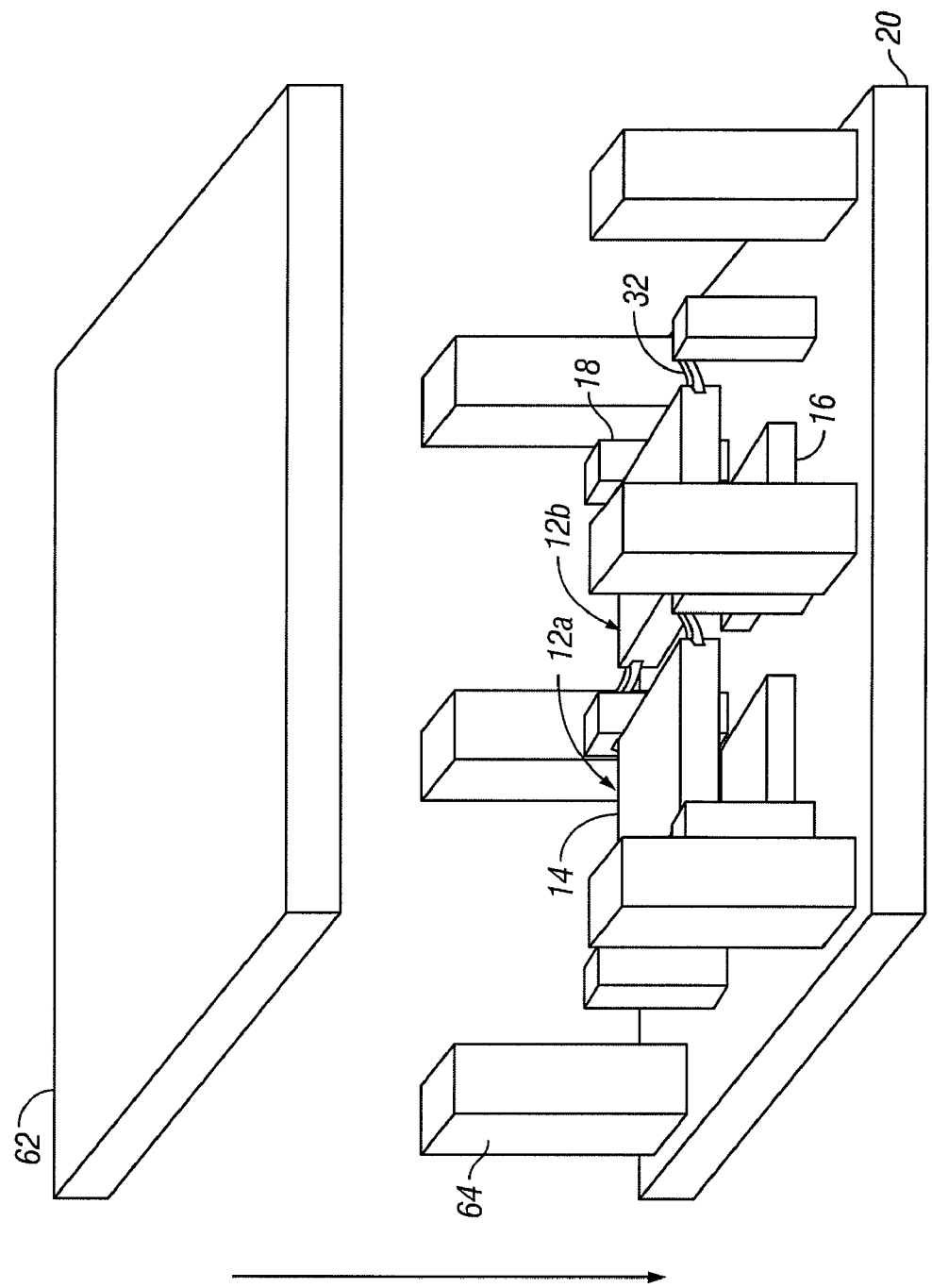
FIGS. 10A and 10B show a side view of an embodiment of a display comprising an array of interferometric modulators in a package.
Figure 10B:
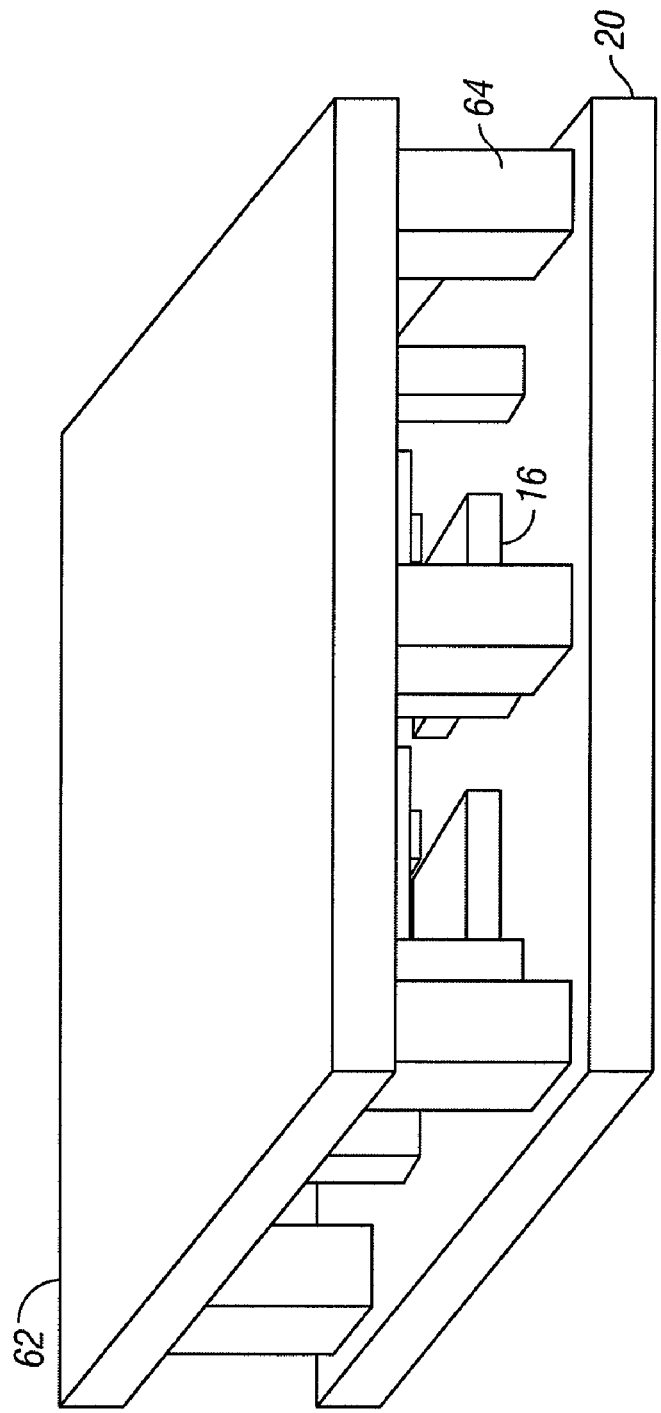

FIGS. 10A-10B show a side view of another embodiment of a display comprising an array of interferometric modulators in a package. In this embodiment, the supports posts 64 are manufactured on the substrate 20 instead of the back plate 62 as shown in the previous embodiment of FIGS. 9A-9B. Upon assembly, the back plate is not in contact with the movable layer. The back plate and the substrate together protect the interferometric modulators from external force.

FIG. 10B illustrates the exemplary display with the back plate 62 joined to the substrate 20. As shown, the support posts 64 are in contact with the back plate 62 after the back plate 62 is joined to the substrate 20, thus separating the back plate 62 from the substrate 20. The mechanical support for the back plate 62 thus comes from the support posts 64. The posts 18 are not in contact with back plate 62 now and thus under no mechanical force from the back plate 62.

The support posts 64 are located in suitable areas between the pixels 12*a* and 12*b* such that the support posts 64 do not interfere with the functioning of the pixels 12*a* and 12*b*. The support posts 64 are typically designed to have the same height. In some embodiments, the support posts 64 are designed to be the same to simplify the manufacturing process. Also, the support posts 64 are designed to have appropriate height such that the posts 18 on the substrate 20 are not in contact with the back plate 62 upon assembly.

In one embodiment (not illustrated), support posts are located on both the back plate and the substrate. The support posts may have the same height and each of the substrate and the back plate may have holes positioned to receive support posts.

The foregoing embodiments relate to a method of packaging a display device and the display device obtained thereof. Though the exemplary embodiment is described using an array of interferometric modulators as an example, the embodiments should not be limited to interferometric modulators. These embodiments are applicable to any suitable MEMS display elements and other types of display elements.

The foregoing description details certain embodiments of the invention. It will be appreciated, however, that no matter how detailed the foregoing appears in text, the invention can be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

What is claimed is:

1. A method of packaging a display device, comprising:
   providing a transparent substrate having a front side and a back side;
   manufacturing an array of display elements on the back side of the substrate, the array configured to modulate light received through the substrate, the array comprising a plurality of posts that are positioned between display elements in the array and connected to electrodes of the display elements;
   providing a back plate; and
   sealing the back plate to the back side of the substrate, wherein one or more posts are in contact with the back plate and connect the back plate to the back side of the substrate after sealing the back plate to the back side of the substrate.

2. The method of claim 1, wherein each display element comprises a MEMS display element.

3. The method of claim 2, wherein each MEMS display element comprises an interferometric modulator.

4. The method of claim 3, wherein each interferometric modulator comprises:

a cavity defined by a fixed first layer deposited on the substrate and a movable second layer connected to the substrate, each of the first and second layer comprising an electrode;

wherein light incident on each interferometric modulator is interferometrically modulated by the first and second layer.

5. The method of claim 4, wherein the second layer is movable between a first and a second position.

6. The method of claim 5, wherein each interferometric modulator is configured to transmit or absorb a substantial amount of visible light while the second layer is in the second position.

7. The method of claim 5, wherein each interferometric modulator is configured to reflect light of a particular wavelength range while the second layer is in the first position.

8. A display device packaged by the method of claim 1.

9. A method of packaging a display device, comprising:
providing a transparent substrate having a front side and a back side;
manufacturing an array of display elements on a back side of the substrate, the array configured to modulate light received through the substrate, the array comprising landing areas, the array further comprising a plurality of posts that are positioned between display elements in the array and connected to electrodes of the display elements;
providing a back plate comprising a plurality of support posts; and
sealing the back plate to the back side of the substrate by aligning and connecting a portion of the support posts with the landing areas.

10. The method of claim 9, wherein each display element comprises a MEMS display element.

11. The method of claim 10, wherein the support posts are substantially the same.

12. The method of claim 10, wherein the support posts are taller than the height of the plurality of posts on the array such that the plurality of posts on the array are not in contact with the back plate after the back plate is sealed to the substrate.

13. The method of claim 10, wherein each landing area is formed as a hole, and wherein the sealing of the back plate to the back side of the substrate comprises placing the support posts into the landing area holes.

14. A display device packaged by the method of claim 9.

15. A method of packaging a display device, comprising:
providing a transparent substrate having a front side and a back side;
manufacturing an array of display elements on a back side of the substrate, the array configured to modulate light received through the substrate, the array comprising a plurality of support posts and further comprising a plurality of connection posts positioned between the display elements in the array and connected to electrodes of the display elements;
providing a back plate; and
sealing the back plate to the back side of the substrate by connecting the back plate to the support posts.

16. The method of claim 15, wherein each display element comprises a MEMS display element.

17. The method of claim 16, wherein the support posts are substantially the same.

18. The method of claim 16, wherein the support posts are higher than the connection posts such that the connection posts on the array are not in contact with the back plate when the back plate is sealed to the back side of the substrate.

19. A display device packaged by the method of claim 15.

20. A display device, comprising:
a front panel comprising
a transparent substrate;
an array of display elements disposed on a back side of the substrate, the array configured to modulate light received through the substrate, the array comprising a plurality of posts disposed between the display elements and connected to electrodes of the display elements; and
a back plate sealed to the back side of the substrate and in contact with at least one of the plurality of posts.

21. A display device, comprising:
a front panel comprising an array of display elements disposed on a back side of a substrate, the array comprising landing areas between the display elements of the array, and the array further comprising a plurality of posts located between the display elements and connected to electrodes of the display elements; and
a back plate sealed to the back side of the substrate, the back plate comprising a plurality of support posts,
wherein at least one of the support posts is in contact with one of the landing areas.

22. The device of claim 21, wherein each display element comprises a MEMS display element.

23. The device of claim 22, wherein the support posts align with the landing areas.

24. The device of claim 22, wherein the support posts are substantially the same.

25. The device of claim 22, wherein the support posts are of a height such that the posts on the array are not in contact with the back plate.

26. The device of claim 22, wherein each landing area is formed as a hole, wherein the support posts are dropped into the holes of the landing areas.

27. A display device, comprising:
a front panel comprising an array of display elements located on a back side of a transparent substrate, the array configured to modulate light received through the substrate, the array comprising a plurality of support posts between the display elements and a plurality of connection posts between the display elements and connected to electrodes of the display elements; and
a back plate sealed to the back side of the substrate,
wherein at least one of the support posts is in contact with the back plate.

28. The device of claim 27, wherein each display element comprises a MEMS display element.

29. The device of claim 28, wherein the support posts are substantially the same.

30. The device of claim 28, wherein the support posts higher than the connection posts such that the connection posts on the array are not in contact with the back plate.

31. The device of claim 28, further comprising:
a display;
a processor that is configured to communicate with said display, said processor being configured to process image data; and
a memory device that is configured to communicate with said processor.

32. The device of claim 31, further comprising a driver circuit configured to send at least one signal to the display.

33. The device of claim 32, further comprising a controller configured to send at least a portion of the image data to the driver circuit.

34. The device of claim 31, further comprising an image source module configured to send said image data to said processor.

35. The device of claim 34, wherein the image source module comprises at least one of a receiver, transceiver, and transmitter.

36. The device of claim 31, further comprising an input device configured to receive input data and to communicate said input data to said processor.

37. A display device, comprising:
- means for modulating light;
- a transparent substrate, wherein the modulating means is configured to modulate light that is received through the transparent substrate;
- means for enclosing the modulating means to form a package; and
- means for supporting the enclosing means, the supporting means connecting the enclosing means to the substrate at a plurality of locations such that the enclosing means does not touch the modulating means, joined to the supporting means to form a package.

38. The device of claim 37, wherein the modulating means comprises an array of interferometric modulators.

39. The device of claim 37, wherein the enclosing means comprises a back plate.

40. The device of claim 38, wherein the supporting means comprises a plurality of support posts on the enclosing means, the support posts being aligned to landing areas on the substrate between the interferometric modulators.

41. The device of claim 38, wherein the supporting means comprises a plurality of posts between the interferometric modulators.

42. The device of claim 41, wherein the plurality of posts are configured to be connected to electrodes of the interferometric modulators.

* * * * *